United States Patent
Dewey et al.

(10) Patent No.: US 10,930,679 B2
(45) Date of Patent: Feb. 23, 2021

(54) THIN FILM TRANSISTORS WITH A CRYSTALLINE OXIDE SEMICONDUCTOR SOURCE/DRAIN

(71) Applicant: Intel Corporation, Santa Clara, CA (US)

(72) Inventors: Gilbert Dewey, Hillsboro, OR (US); Abhishek A. Sharma, Hillsboro, OR (US); Shriram Shivaraman, Hillsboro, OR (US); Van H. Le, Beaverton, OR (US); Ravi Pillarisetty, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/461,701

(22) PCT Filed: Dec. 28, 2016

(86) PCT No.: PCT/US2016/069006
§ 371 (c)(1),
(2) Date: May 16, 2019

(87) PCT Pub. No.: WO2018/111311
PCT Pub. Date: Jun. 21, 2018

(65) Prior Publication Data
US 2019/0363193 A1 Nov. 28, 2019

Related U.S. Application Data

(63) Continuation-in-part of application No. PCT/US2016/066416, filed on Dec. 13, 2016.

(51) Int. Cl.
*H01L 27/12* (2006.01)
*H01L 27/108* (2006.01)
(Continued)

(52) U.S. Cl.
CPC .... *H01L 27/1229* (2013.01); *H01L 27/10805* (2013.01); *H01L 27/10873* (2013.01);
(Continued)

(58) Field of Classification Search
CPC ........... H01L 2021/775; H01L 27/1214; H01L 27/1222; H01L 27/1229; H01L 27/124;
(Continued)

(56) References Cited

U.S. PATENT DOCUMENTS 5,995,187 A * 11/1999 Wakagi ............. G02F 1/134363
349/141
6,271,542 B1 * 8/2001 Emma ................. H01L 27/1108
257/67
(Continued)

OTHER PUBLICATIONS

International Preliminary Report on Patentability from PCT/US2016/069006 dated Jun. 27, 2019, 7 pgs.
(Continued)

*Primary Examiner* — Eduardo A Rodela
(74) *Attorney, Agent, or Firm* — Green, Howard & Mughal LLP (57) ABSTRACT

Thin film transistors (TFTs) including a channel and source/drain that comprise an oxide semiconductor. Oxide semiconductor within the source/drain may be more ordered than the oxide semiconductor within the channel. The localized increased order of the oxide semiconductor may reduce TFT access resistance while retaining good channel gating properties. In some embodiments, order within the source or drain templates from order in adjacent contact metallization. Contact metal at the interface of the oxide semiconductor may be chosen to promote grain growth in the oxide semiconductor during deposition of the oxide semiconductor, or through solid phase epitaxy of the oxide semiconductor subsequent to deposition. Where TFT circuitry is integrated into the BEOL of a CMOS FET IC fabrication process, an EOL forming gas anneal may be employed to both passivate CMOS FETs and crystalize a source/drain of the TFTs.

21 Claims, 6 Drawing Sheets

(51) Int. Cl.
- *H01L 29/22* (2006.01)
- *H01L 29/423* (2006.01)
- *H01L 29/66* (2006.01)
- *H01L 29/786* (2006.01)
- *H01L 29/49* (2006.01)

(52) U.S. Cl.
CPC ........ *H01L 27/124* (2013.01); *H01L 27/1281* (2013.01); *H01L 29/2206* (2013.01); *H01L 29/42384* (2013.01); *H01L 29/4908* (2013.01); *H01L 29/66757* (2013.01); *H01L 29/786* (2013.01); *H01L 29/78651* (2013.01); *H01L 29/78693* (2013.01)

(58) Field of Classification Search
CPC ............. H01L 27/1251; H01L 27/1259; H01L 27/127; H01L 27/1274; H01L 27/1281; H01L 27/1285; H01L 27/1288; H01L 27/04; H01L 27/0688; H01L 27/1225; H01L 27/1266; H01L 2027/11883; H01L 2027/11885; H01L 2027/11887; H01L 2027/11888

See application file for complete search history.

(56) References Cited

U.S. PATENT DOCUMENTS

| | | | |
|---|---|---|---|
| 6,319,761 | B1 | 11/2001 | Zhang et al. |
| 6,787,914 | B2 * | 9/2004 | Fortin ................. H01L 21/2855 257/752 |
| 2003/0201442 | A1 | 10/2003 | Makita et al. |
| 2004/0065913 | A1 | 4/2004 | Shimada et al. |
| 2005/0156217 | A1 | 7/2005 | Shimada et al. |
| 2006/0003503 | A1 | 1/2006 | Yang et al. |
| 2007/0007571 | A1 | 1/2007 | Lindsay et al. |
| 2009/0149012 | A1 | 6/2009 | Brask et al. |
| 2010/0103159 | A1 * | 4/2010 | Leon .................... G09G 3/3233 345/212 |
| 2010/0117147 | A1 | 5/2010 | Kim et al. |
| 2011/0147856 | A1 * | 6/2011 | Sasaki ............... H01L 29/66795 257/401 |
| 2011/0266537 | A1 | 11/2011 | Ye |
| 2013/0248852 | A1 * | 9/2013 | Yokozeki ............. H01L 29/786 257/43 |
| 2014/0183525 | A1 * | 7/2014 | Kaneko ............... H01L 29/7869 257/43 |
| 2014/0191237 | A1 | 7/2014 | Hekmatshoartabari et al. |
| 2014/0377906 | A1 | 12/2014 | Lin et al. |
| 2015/0255139 | A1 * | 9/2015 | Atsumi ............... H01L 29/7869 257/43 |
| 2015/0263176 | A1 | 9/2015 | Cheng |
| 2015/0303311 | A1 | 10/2015 | Yu et al. |
| 2015/0357480 | A1 | 12/2015 | Yu et al. |
| 2016/0035755 | A1 * | 2/2016 | Li ....................... H01L 27/1225 257/40 |
| 2016/0086802 | A1 | 3/2016 | Hong et al. |
| 2017/0186783 | A1 * | 6/2017 | Hu ...................... H01L 27/1281 |
| 2018/0004883 | A1 * | 1/2018 | Yuan ................... G06F 17/5072 |
| 2018/0158843 | A1 * | 6/2018 | Lius ...................... G02F 1/1368 |
| 2018/0301380 | A1 | 10/2018 | Or-Bach et al. |

OTHER PUBLICATIONS

International Search Report & Written Opinion dated Aug. 23, 2017 for PCT Patent Application No. PCT/US16/69006.

* cited by examiner

THIN FILM TRANSISTORS WITH A CRYSTALLINE OXIDE SEMICONDUCTOR SOURCE/DRAIN

CLAIM OF PRIORITY

This Application is a National Stage Entry of, and claims priority to, PCT Application No. PCT/US2016/069006, filed on Dec. 28, 2016 and titled "THIN FILM TRANSISTORS WITH A CRYSTALLINE OXIDE SEMICONDUCTOR SOURE/DRAIN", which claims priority to PCT Application No. PCT/US2016/066416, filed on Dec. 13, 2016 and titled "PASSIVATION DIELECTRICS FOR OXIDE SEMICONDUCTOR THIN FILM TRANSISTORS", which is incorporated by reference in its entirety for all purposes.

BACKGROUND

Thin-film transistors (TFTs) are a class of field-effect transistors (FETs) in which the channel material is a deposited thin film rather than a monocrystalline material. A common application of TFT technology is liquid crystal displays (LCD), but they are also advantageous in other applications as the thin film deposition processes employed in TFT fabrication are relatively low (e.g., below 450° C.). TFTs can be made using a wide variety of semiconductor materials, such as silicon, germanium, silicon-germanium, as well as various oxide semiconductors (a.k.a. semiconducting oxides) including metal oxides like indium gallium zinc oxide (IGZO).

BRIEF DESCRIPTION OF THE DRAWINGS

The material described herein is illustrated by way of example, and not by way of limitation, in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material over or under another may be directly in contact or may have one or more intervening materials. Moreover, one material between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Transistors incorporating an oxide semiconductor channel coupled to contact metallization through oxide semiconductor source and/or drain (source/drain) regions are described herein. TFT device performance depends at least in part on the extent of structural order in a thin film of oxide semiconductor. For example, the oxide semiconductor thin film can be amorphous (i.e., having no structural order), or polycrystalline (e.g., having micro-scale to nano-scale crystal grains). In accordance with some advantageous embodiments, oxide semiconductor source/drains of a transistor have greater structural order than the oxide semiconductor channel. Methods of fabricating such transistors are also described herein. In accordance with some advantageous embodiments, contact metallization is employed as an epitaxial template to impart greater order in the oxide semiconductor source/drain proximal to the contact metallization than in an oxide semiconductor channel distal from the contact metallization. In some embodiments, a thermal anneal is performed following the formation of the contact metallization and the oxide semiconductor source/drain. In some advantageous embodiments wherein contact metallization is deposited on an oxide semiconductor thin film, solid-phase epitaxy or melt recrystallization occurs during a subsequent anneal.

The inventors have found that certain contact metals possessing an appropriate grain structure at the interface of the oxide semiconductor can promote solid-phase crystallization within a volume of oxide semiconductor proximal to the interface. The inventors have further found that such crystallization can increase the conductivity of the oxide semiconductor relative to oxide semiconductor having the same material composition but less crystallinity. This characteristic may be leveraged in TFT cell architectures, for example by confining oxide semiconductor having less-ordered microstructure and good gating properties to precisely within a channel (region) of the device. Oxide semiconductor having greater order is confined to extrinsic portions of the device, which may reduce extrinsic (access) resistance.

In some advantageous embodiments, the inventors have found that when a TFT is fabricated in back-end-of-line (BEOL) logic circuitry subsequent to the fabrication of front-end-of-line (FEOL) logic circuitry employing conventional monocrystalline-channeled metal-oxide-semiconductor FETs (MOSFETs), the oxide semiconductor interfacing the TFT contact metallization to the oxide semiconductor channel may undergo controlled recrystallization during a final EOL anneal. As a "passivation anneal" is often advantageous for the FEOL FETs, improved TFT performance may be accordingly achieved in hybrid TFT-CMOS circuitry with little increase in process complexity and/or cost.

Figure 1A:
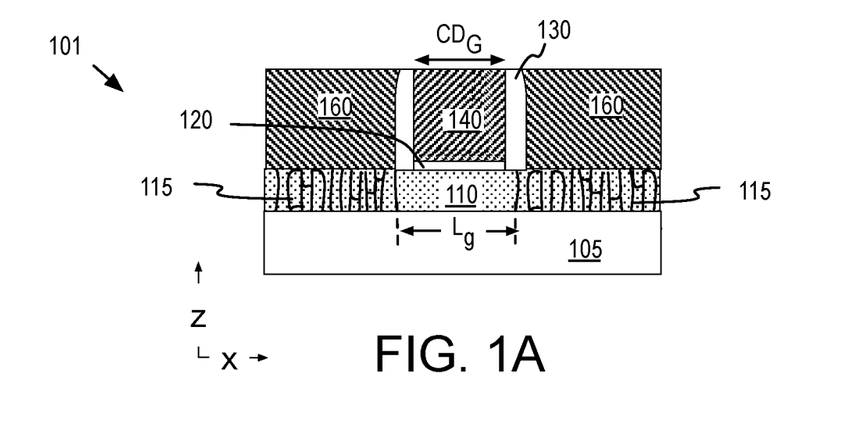
FIGS. 1A, 1B, and 1C illustrate cross-sectional views through a length of channel semiconductor and source/drain semiconductor of TFT cells, in accordance with some embodiments.
Figure 1B:
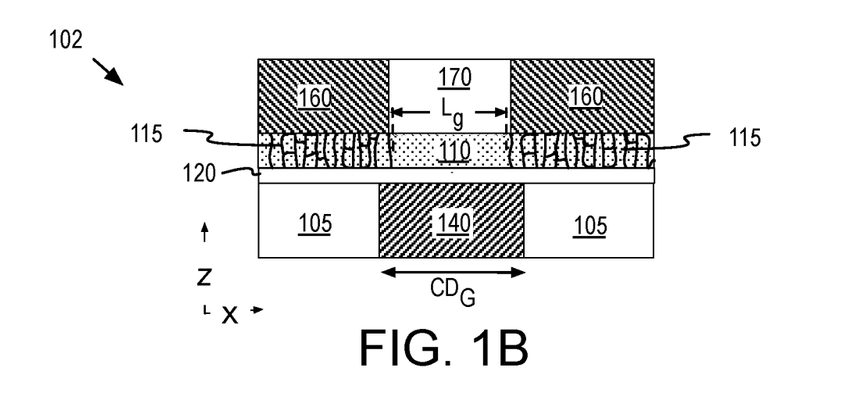
Figure 1C:
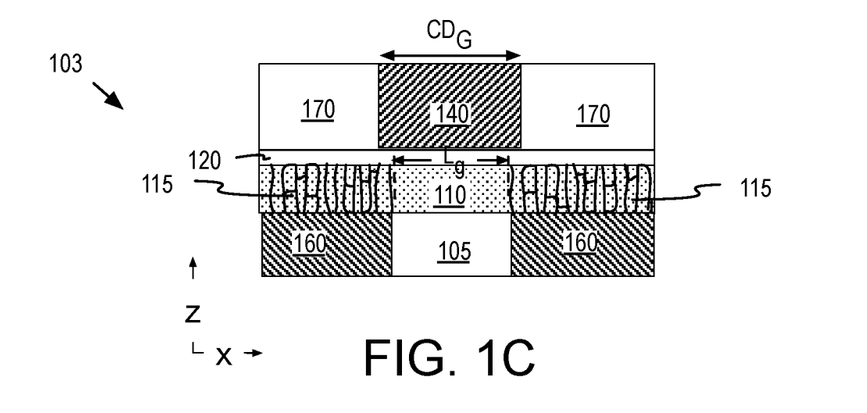

FIGS. 1A, 1B, and 1C illustrate cross-sectional views of TFT cells having source/drain regions that are more crystalline than a gate-coupled channel region, in accordance with some embodiments. In FIG. 1A-1C, the cross-section shown is through a length of channel semiconductor and source/drain semiconductor on either side of the channel semiconductor. Referring first to FIG. 1A, TFT cell 101 includes a semiconductor thin film 110 deposited over a substrate layer 105. In some exemplary embodiments, substrate layer 105 is amorphous. Substrate layer 105 may be a dielectric material, such as, but not limited to, silicon dioxide (SiO), a silicon nitride (SiN), silicon oxynitride (SiON), or low-k dielectric (e.g., having a dielectric constant below 3.5). While semiconductor thin film 110 may have any composition known to be suitable as a TFT channel material, such as a group IV material (e.g., Si, Ge, SiGe), in some advantageous embodiments semiconductor thin film 110 is an oxide semiconductor. An oxide semiconductor is a semiconducting oxide. Oxide semiconductors can be advantageous for low temperature transistor fabrication, and can have excellent transistor characteristics offering high carrier mobility and a tunable material band gap and resistivity. Many oxide semiconductors have been studied, initially in the context of discrete rectifiers, and more recently in the context of transparent TFTs for display applications. Examples include metal oxides with a transition metal (e.g., IUPAC group 4-10) or post-transition metal (e.g., IUPAC groups 11-15). In advantageous embodiments, the metal oxide includes at least one of Mg, Cu, Zn, Sn, Ti, Ni, Ga, In, Sb, Sr, Cr, Co, V, or Mo. The metal oxides may be suboxides ($A_2O$), monoxides (AO), binary oxides ($AO_2$), ternary oxides ($ABO_3$), and mixtures thereof.

Oxide semiconductor thin film 110 may be a p-type, n-type, or intrinsic material. A number of oxide semiconductors have been found to be capable of significant electron densities. Some oxide semiconductors have also been found to be capable of significant electron hole densities. Many oxide semiconductors have high defect density nearer the valence band, but display good n-type electrical properties. Some oxide semiconductors have high defect density in the conduction band, but display good p-type electrical properties. In some embodiments, semiconductor thin film 110 comprises a tin oxide ($SnO_x$), such as Tin (IV) oxide, or $SnO_2$. In other embodiments, the tin oxide is Tin (II) oxide (SnO) or a mixture of SnO and $SnO_2$, where x may range between 1 and 2. While the range of x may be expanded, semiconducting properties may be lost (e.g., the material becomes a pure conductor if x is to low, and a pure insulator if x is too high). In some other embodiments, semiconductor thin film 110 comprises a zinc oxide ($ZnO_x$), such as Zn(II) oxide, or ZnO. In other embodiments, the zinc oxide is zinc peroxide ($ZnO_2$) or a mixture of ZnO and $ZnO_2$, where x may range between 1 and 2. In some other embodiments, semiconductor thin film 110 comprises titanium oxide ($TiO_x$), or $SnO_x$. Exemplary oxide semiconductors that may have suitable p-type conductivity include copper oxide ($CuO_x$). In some $CuO_x$ embodiments, oxide semiconductor thin film 110 is Cu(I) oxide, or $Cu_2O$. In other embodiments, oxide semiconductor thin film 110 is Cu(II) oxide (CuO) or a mixture of CuO and $Cu_2O$, where x may range between 0.5 and 1. Other exemplary oxide semiconductor thin film 110 compositions include $NiO_x$.

Oxide semiconductor conductivity type is a function of composition. Although not bound by theory, the basis for n-type conductivity in many oxide semiconductors may be the presence of oxygen vacancies. The presence of other electrically active dopants, such as hydrogen, or one or more metal species, may also serve as a means of tuning the semiconducting properties of the oxide semiconductor. Semiconductor oxide thin film 110 may be intentionally doped, or not. Compared to intrinsic oxide semiconductor that is not intentionally doped, n-type and p-type oxide semiconductors may have a higher concentration of impurities, such as, but not limited to, one or more group III element, group V element, and/or elemental hydrogen (H). Dopant levels in oxide semiconductor thin film 110 may be selected to arrive at optimal threshold voltage associated with gating the oxide semiconductor within the channel region and/or for lowest bulk and/or junction resistance within the source and/or drain region. Semiconductor thin film 110 may comprise $ZnO_x$ doped with In and Ga, for example. In some specific embodiments, semiconductor thin film 110 is $InGaO_3(ZnO)_5$, often referred to a simply IGZO.

In the illustrative embodiment, semiconductor thin film 110 is compositionally homogeneous. A channel region under gate electrode 140 and associated with a channel length $L_g$, has the same oxide semiconductor composition as the source/drain regions 115. As such, the TFT channel region is coupled to contact metallization 160 through semiconductor homojunctions. In alternative embodiments, semiconductor thin film 110 is compositionally heterogeneous between the channel region and at least one of the source/drain regions 115. The TFT channel region is then coupled to contact metallization 160 through semiconductor heterojunctions. In such embodiments, source/drain regions 115 may both include the same oxide semiconductor having a different composition than the channel region. Alternatively, source/drain regions 115 may be two different oxide semiconductors, and may also have complementary conductivity types (e.g., where TFT cell 101 is operable as a tunnel FET).

While semiconductor oxides may display some level of structural ordering (e.g., nanocrystallinity), in some embodiments amenable to lowest processing temperatures, oxide semiconductor thin film 110 may be deposited in an amorphous state. In some exemplary embodiments, source/drain regions 115 are more ordered (i.e., more crystalline) than the channel region between source/drain regions 115. For example, oxide semiconductor within the channel region may be amorphous while oxide semiconductor within the source and/or drain region is polycrystalline. The size of crystal grains within source and/or drain region may vary (e.g., from nanocrystalline or microcrystalline). However, for embodiments where the oxide semiconductor within the channel is polycrystalline, the size of the crystal grains within the source and/or drain region may be significantly (e.g., greater than 15%) larger than those in the channel region.

In some exemplary embodiments, oxide semiconductor at an interface with contact metallization 160 has a crystal texture associated with the contact metallization crystallinity. Hence, grains within source/drain regions 115 have a distribution of crystallographic orientations that is associated with crystal texture within contact metallization 160. Grains within source/drain regions 115 are therefore non-random and have some preferred orientation that is associated with the preferred orientation of grains within contact metallization 160. The association of the grain texture within source/drain regions 115 and contact metallization 160 is indicative of epitaxial templating of crystal growth within the source/drain regions 115 off of granular texture present in contact metallization 160.

For embodiments where oxide semiconductor thin film 110 is disposed or located between an amorphous layer and contact metallization 160, the inventors currently understand contact metallization 160 must be compatible with oxide semiconductor thin film 110 to ultimately induce crystallization in the oxide semiconductor proximal to the interface of contact metallization 160. Specifically, contact metallization 160 is to be of a composition that when deposited to interface the chosen oxide semiconductor will, either as deposited, or upon subsequent annealing, possess crystallinity that serves as a suitable template for subsequent crystallization within the oxide semiconductor proximal to the interface of the contact metallization. As such, not all contact metallizations can be expected to be a suitable template. Where contact metallization 160 comprises more than one compositional layer, at least the layer of metal in contact with oxide semiconductor 110 is to be of a suitable composition for driving crystallization within the oxide semiconductor. In some further embodiments, contact metallization 160 has a relatively low affinity for oxygen to limit oxygen gettering. In some embodiments, contact metallization 160 includes a metal nitride at the interface of (i.e., in direct contact with) oxide semiconductor thin film 110. Metal nitrides offer good stability and do not ready oxidize. Exemplary metal nitrides include TiN, TaN, and WN. Whereas Ti, Ta and W interfacial metallization layers may be unsuitable (e.g., may remain amorphous and/or may getter oxygen), the inventors have found one or more of their nitrides do provide a good template for promoting crystallization within the oxide semiconductor. In other exemplary embodiments, contact metallization 160 includes a noble metal (e.g., Pt) at the interface of (i.e., in direct contact with) oxide semiconductor thin film 110.

In some embodiments, and as illustrated in FIG. 1A, source/drain regions 115 have columnar grain structure. Although not illustrated in FIG. 1A, for some such embodiments, contact metallization 160 also has columnar grain structure. TiN, for example can be deposited onto an oxide semiconductor, such as IGZO, in a manner that results in a columnar grain structure, either as deposited, or upon subsequent thermal processing. In some embodiments, columnar grains within contact metallization 160 have their longitudinal axes preferentially oriented perpendicular to the interface of source/drain region 115 and contact metallization 160. In some such embodiments, columnar grains within source/drain region 115 likewise have their longitudinal axis preferentially oriented perpendicular to the interface of source/drain region 115 and contact metallization 160.

When grain growth within the source/drain regions is templated at the interface with contact metallization, the extent of crystallinity within an oxide semiconductor is a function of the anneal conditions (e.g., time and temperature) as well as the texture of the contact metallization. Columnar grains preferentially oriented perpendicular to the interface of source/drain region 115 may advantageously favor grain growth through a thickness of the oxide semiconductor thin film relative to lateral grain growth beyond edges of the contact metallization. In some advantageous embodiments, grain growth extends through a thickness of the oxide semiconductor that is at least equal to the depth of the channel region. In some embodiments, grain growth extends through the entire thickness of the oxide semiconductor thin film. For example, in TFT cell 101 (FIG. 1A) columnar grains are present throughout the entire (z) thickness of oxide semiconductor thin film 110. In some such embodiments, oxide semiconductor thin film 110 within source/drain regions 115 has a thickness of 5-20 nm. In some further embodiments, crystallinity of source/drain regions 115 extends laterally (e.g., x-dimension) beyond an edge of contact metallization 160. The amount of this lateral grain growth will reduce the effective gate length $L_g$ of the channel region, and so it is ideally well controlled. In some embodiments, crystallinity of source/drain regions 115 extends laterally by an amount that is less than the thickness (e.g., z-dimension) of the crystalline source/drain regions. In some further embodiments, crystallinity of source/drain regions 115 extends laterally by an amount less than the lateral width of an overlying dielectric spacer 130 separating contact metallization 160 from gate electrode 140. In some embodiments, crystallinity of source/drain regions 115 extends laterally by 2-10 nm from an edge of the contact metallization toward the channel region.

In some embodiments, a TFT with ordered source/drain oxide semiconductor includes a less-ordered channel region that is operable to be gated by a gate electrode separated from the channel region by a gate dielectric. In TFT cell 101 for example, a high-k gate dielectric 120 is between gate electrode 140 and the channel region of oxide semiconductor thin film 110. Depending on the conductivity type of the oxide semiconductor, the gate stack is to modulate the oxide semiconductor between intrinsic and n-type or p-type material through the field effect. To do so, gate dielectric 120 is to form an interface of suitable quality. In some exemplary embodiments, gate dielectric 120 comprises a high-k dielectric having a bulk relative dielectric constant greater than at least 9. The gate dielectric may include one or more material layers. In some such embodiments, the high-k gate dielectric includes at least one $Al_2O_3$, $HfO_2$, or $HfAlO_x$ in direct contact with the oxide semiconductor. Silicates such as HfSiOx or TaSiOx may also be suitable for either direct contact with the oxide semiconductor or with an underlying interfacial layer of the gate dielectric. $HfO_2$ may give better gate control for zinc oxide (e.g., IGZO) embodiments than do alternatives such as $Al_2O_3$. However, both $Al_2O_3$, $HfO_2$ have been found to display results superior to a conventional silicon-based gate dielectrics (e.g., $SiO_2$). One or more material providing a suitable work function may be employed for gate electrode 140. In some advantageous embodiments, gate electrode 140 includes a metal with a work function below 5 eV. The metal gate electrode may include an elemental metal layer, a metal alloy layer, or laminate structure of either or both. In some embodiments the gate electrode is a metal nitride, such as TiN (e.g., 4.0-4.7 eV). The gate electrode may also comprise Al (e.g., TiAlN). Other alloy constituents may also be employed, such as, but not limited to C, Ta, W, Pt, and Zn. Gate electrode 140 may have any lateral critical dimension (CDG). In some exemplary underlap embodiments, CDG is less than the effective gate length $L_g$ in FIG. 1A. In some exemplary overlap embodiments, CDG is greater than the effective gate length $L_g$. In some embodiments where oxide semiconductor thin film 110 is of a homogenous composition (i.e., channel and source/drain regions have the same composition), the difference between CDG and $L_g$ is a function of lateral crystallization of source/drain regions 115.

Dielectric spacer 130 may be of any composition known to have properties suitable as an insulator separating gate electrode 140 from contact metallization 160. Dielectric spacer 130 may be SiO, SiN, SiON, or any known low-k material (e.g., SiOC, etc.). Dielectric spacer 130 may have any lateral dimensions. In some exemplary embodiments, dielectric spacer 130 has a lateral width (e.g., x-dimension) of 5-20 nm. Although not depicted in FIG. 1A, the terminals of TFT cell 101 may be interconnected with one or more other TFTs, or other FETs, by one or more interconnect metallization levels to form a functional integrated circuit.

TFTs with ordered source/drain regions in accordance with embodiments herein may have a wide range of architectures. For example, a TFT with ordered source/drain regions may include a bottom-side gate, rather than (or in addition to) the top-side gate electrode illustrated in FIG. 1A. A TFT cell 102 with a bottom-side gate in accordance with some embodiments is further illustrated in FIG. 1B. As shown, gate electrode 140 is embedded in a dielectric substrate layer 105. Gate dielectric 120 is further disposed over substrate layer 105. Oxide semiconductor thin film 110 is over (e.g., in direct contact with) gate dielectric 120. Substrate layer 105, gate electrode 140, gate dielectric 120, and oxide semiconductor thin film 110 may be any of those materials described above in the context of FIG. 1A. Gate dielectric 120 may be amorphous, in which case the ordering of source/drain regions 115 illustrated in FIG. 1B templates from ordering in the overlying contact metallization 160. Contact metallization 160 may have any of the compositions described above in the context of FIG. 1A, for example. Where there is not also a top-side gate electrode, an ILD 170 may be between separate features of contact metallization 160.

As another example, a TFT with ordered source/drain regions may include bottom-side contact metallization, rather than (or in addition to) the top-side contact metallization that was illustrated in FIGS. 1A and 1B. A TFT cell 103 with a bottom-side contact metallization in accordance with some embodiments is further illustrated in FIG. 1C. As shown, contact metallization 160 is embedded in substrate layer 105. Oxide semiconductor thin film 110 is over (e.g., in direct contact with) contact metallization 160. Gate dielectric 120 is further over oxide semiconductor thin film 110. Gate electrode 140 is over (e.g., in direct contact with) gate dielectric 120. Where there is no top-side contact metallization, a dielectric ILD 170 is over source/drain regions 115 (e.g., in direct contact with gate dielectric 120). Substrate layer 105, gate electrode 140, gate dielectric 120, oxide semiconductor thin film 110, and contact metallization 160 may be any of those materials described above in the context of FIG. 1A. Gate dielectric 120 may again be amorphous, in which case the ordering of source/drain regions 115 illustrated in FIG. 1C templates from crystallinity in the underlying contact metallization 160. Such ordering may occur during the deposition of oxide semiconductor thin film 110 (i.e., the oxide semiconductor is epitaxially deposited/grown), and/or solid phase crystallization may occur within source/drain regions 115 during a thermal treatment subsequent to the deposition of oxide semiconductor thin film 110.

Figure 2A:
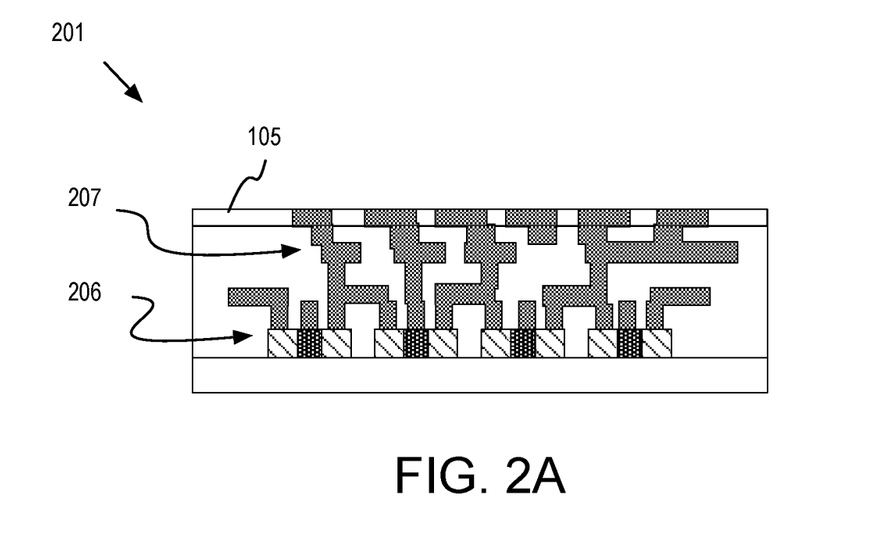
FIGS. 2A and 2B are cross-sectional views of a substrate for the TFT cells of FIG. 1A-1C are fabricated upon, in accordance with some embodiments.

FIGS. 2A and 2B are cross-sectional views of substrates upon which a TFT cell including an ordered source/drain, such as the TFT cells illustrated FIG. 1A-1C, may be fabricated. In some embodiments, a TFT cell including an ordered source/drain is fabricated over one or more interconnect metallization levels integrating a plurality of silicon CMOS FETs. In the example shown in FIG. 2A, substrate 201 includes a plurality of CMOS FETs 206 that employ a substantially monocrystalline channel material, such as, but not limited to, silicon. CMOS FETs 206 may be finFETs, for example. CMOS FETs 206 are interconnected with one or more levels of interconnect metallization 207. Over any given interconnect metallization level (e.g., metal 4), a TFT may be fabricated over substrate layer 105 as part of a BEOL fabrication process. The interconnect metallization may, at least in part, serve as the gate electrode and/or contact metallization of the overlying TFT cell.

Figure 2B:
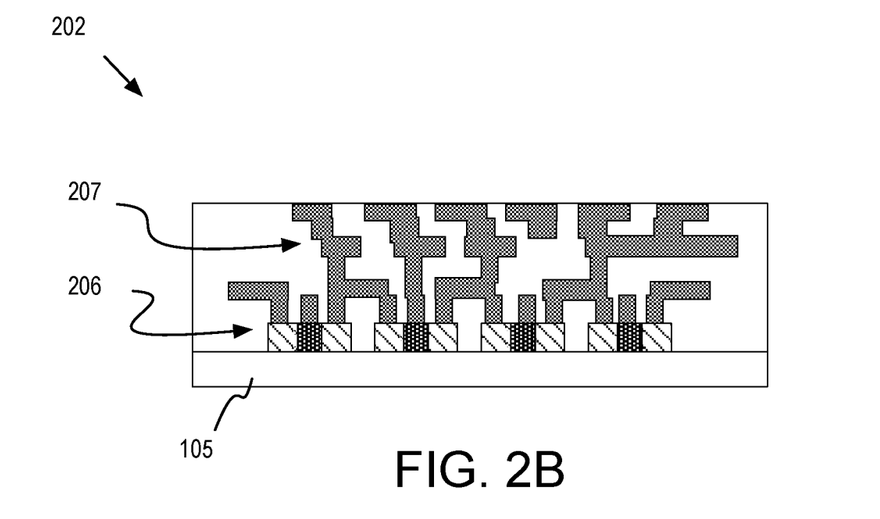

In some embodiments, a TFT cell including an ordered source/drain is fabricated on a back-side of a plurality of silicon CMOS FETs. In the example shown in FIG. 2B, substrate 202 includes a plurality of CMOS FETs 206 that employ a substantially monocrystalline channel material, such as, but not limited to, silicon. In the context of substrate 202, CMOS FETs 206 may again be finFETs, for example. CMOS FETs 206 are interconnected with one or more levels of interconnect metallization 207 over a front-side of CMOS FETs 206. On a side of CMOS FETs 206 opposite interconnect metallization 207, a TFT cell may be fabricated over substrate layer 105 as part of a transistor substrate back-side fabrication process.

Figure 3:
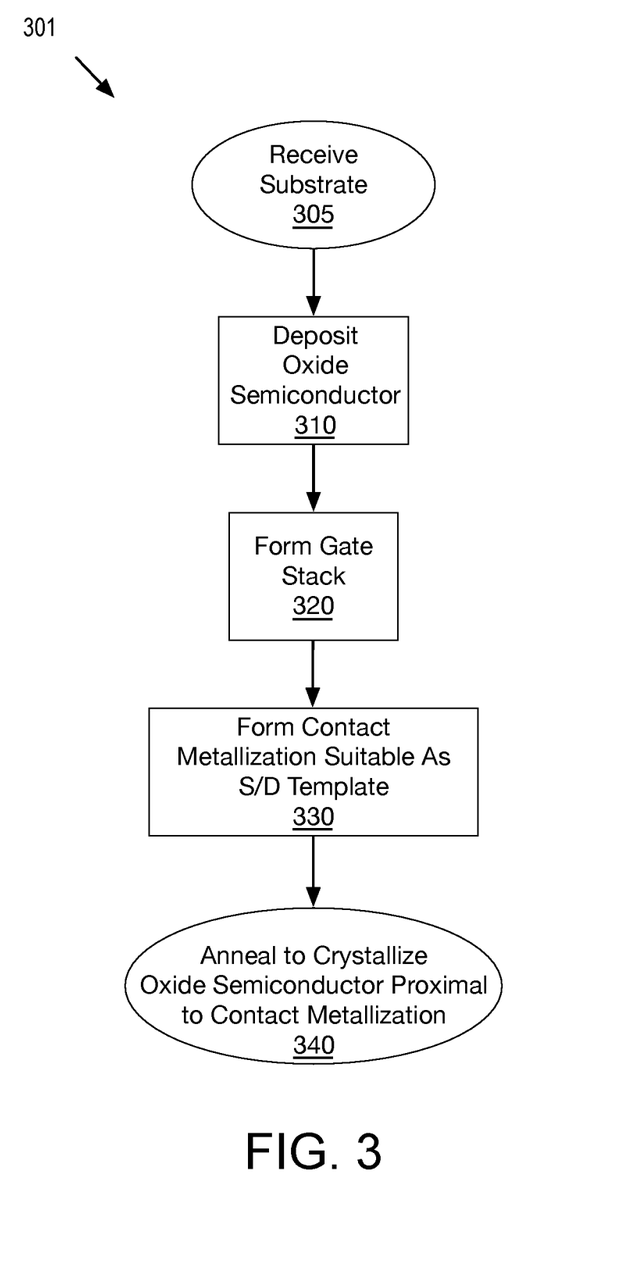
FIG. 3 is a flow diagram illustrating methods for fabricating a TFT cell, in accordance with some embodiments.
Figure 4A:
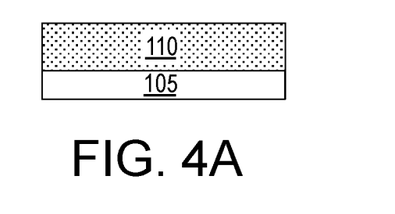
FIGS. 4A, 4B, 4C, and 4D illustrate cross-sectional views through a length of channel semiconductor and source/drain semiconductor of the TFT cell depicted in FIG. 1A evolving as operations in the method shown in FIG. 3 are practiced, in accordance with some embodiments.
Figure 4B:
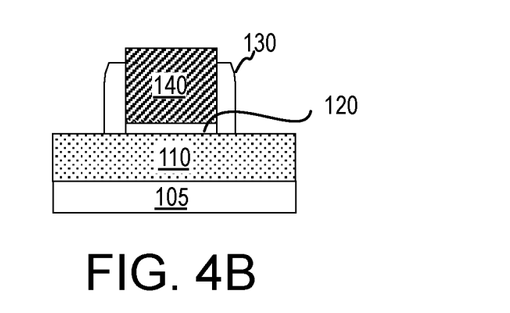
Figure 4C:
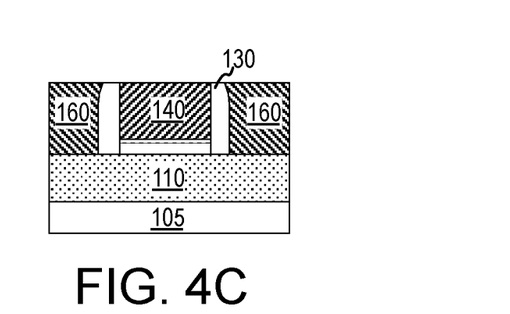
Figure 4D:
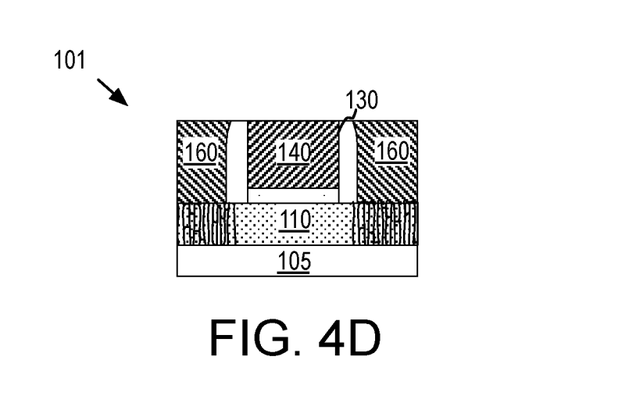

The TFTs described above may be fabricated on a substrate in a variety of manners. FIG. 3 is a flow diagram illustrating exemplary methods 301 for fabricating a TFT cell, in accordance with some embodiments. Methods 301 may be employed to fabricated TFT cell 101 (FIG. 1A), for example. FIGS. 4A, 4B, 4C, and 4D illustrate cross-sectional views through a length of channel semiconductor and source/drain semiconductor of a TFT that evolves as operations in methods 301 are practiced, in accordance with some specific embodiments.

Referring first to FIG. 3, methods 301 begin at operation 305 where a substrate is received. The substrate may have any architecture suitable for fabrication of a TFT cell, such as, but not limited to, substrate 201 or 202 introduced above, a display substrate, or similar. An oxide semiconductor thin film is then deposited over a substrate layer at operation 310. Any deposition process known to be suitable for a desired oxide semiconductor composition may be performed at operation 310, such as, but not limited to pulsed laser deposition (PLD), oxidation processing where a precursor is spin-coated and oxidized during an anneal, chemical vapor deposition (CVD), and atomic layer deposition (ALD). In the example further illustrated in FIG. 4A, an amorphous oxide semiconductor thin film 110 (e.g., comprising IGZO) is deposited on a substrate layer 105 that includes an amorphous dielectric layer.

Returning to FIG. 3, methods 301 continue at operation 320 where a gate stack is formed over a channel region of the oxide semiconductor thin film. The gate stack may be formed by any technique known to be suitable for a TFT. In exemplary embodiments further illustrated in FIG. 4B, gate dielectric 120, comprising any of the materials introduced above, is deposited over (e.g., in direct contact with) a channel region of oxide semiconductor thin film 110. In some embodiments, an ALD process is employed to deposit a high-k gate dielectric film directly on a surface of oxide semiconductor thin film 110. A gate electrode 140, comprising any of the materials introduced above, is deposited over (e.g., in direct contact with) gate dielectric 120. In some embodiments, gate electrode 140 is deposited by CVD, ALD, physical vapor deposition (PVD), or any other technique known to be suitable for forming the desired material. The gate stack is then patterned, for example by masking and etching at least the gate electrode material layer. A dielectric film may then be deposited and recess etched with any suitable anisotropic etch process to form dielectric spacer 130 along a sidewall of gate electrode 140. Any gate dielectric 120 unmasked by the gate stack or gate sidewall spacer may then be removed with any process (e.g., wet or dry etch) known to be suitable for the gate dielectric composition.

Returning to FIG. 3, methods 301 continue at operation 330 where contact metallization is formed over source/drain regions of the oxide semiconductor thin film. Any deposition process known to be suitable for depositing a particular contact metallization composition may be performed at operation 330. In some embodiments, the deposition process induces order in the contact metallization. In the exemplary embodiment shown in FIG. 4E, contact metallization 160 is deposited in direct contact with portions of oxide semiconductor thin film 110 not protected by gate electrode 140 and dielectric spacer 130. Contact metallization 160 may have any of the compositions described above. Contact metallization 160 may be deposited by a technique that favors the formation of grains at an interface with oxide semiconductor thin film 110. Contact metallization 160 may be deposited by a technique that favors columnar growth of grains formed at the interface of oxide semiconductor thin film 110. In some embodiments, PVD or ALD is employed to deposit a metal nitride (e.g., TiN) directly on oxide semiconductor thin film 110.

Returning to FIG. 3, methods 301 continue at operation 340 where a thermal anneal is performed to crystallize a region of the oxide semiconductor thin film proximal to the contact metallization. One or more capping dielectric layers and/or interconnect metallization levels may be deposited over the TFT before the anneal is performed. Where the substrate includes CMOS circuitry, the TFT cells may also be interconnected with the CMOS circuitry prior to the thermal anneal. Thermal anneal operation 340 entails exposing the TFT circuitry (and CMOS circuitry) to an elevated temperature. The elevated temperature may be higher than any prior processing the TFT(s) were exposed to. The elevated temperature is advantageously 300° C., or more, and may be as high as 500° C., depending on tolerance of the substrate (including CMOS circuitry, if present) and the TFT circuitry to such thermal processing. The anneal operation 340 may be of short duration (e.g., on the order of seconds) in some rapid thermal processing embodiments. In alternative embodiments, the anneal operation 340 may be of longer duration (e.g., minutes to hours). Anneal duration for a given annealing process may be selected to control the extend of crystallization. For example, the anneal duration may be selected to ensure source/drain crystallinity does not extend through the channel region, potentially shorting the source and drain, or otherwise detrimentally impacting channel gate control.

In some embodiments, anneal operation 340 is performed in a non-oxidizing environment. In a specific embodiment where the TFTs are fabricated in the BEOL of a CMOS FET fabrication process, the anneal operation 340 comprises a post-passivation EOL, or "final" anneal performed in a forming gas ($H_2:N_2$) environment at 400° C., or less. Such forming gas anneals are often performed in a CMOS FET fabrication process as a way of passivating interfacial bonds. When performed after the fabrication of a TFT having an oxide semiconductor interface with a contact metal suitable for templating crystallization, an oxide semiconductor region proximal to the interface can crystallize with texture attributable to the contact metal, for example as described above. Electrical test (ET) performed before and after the anneal has also shown TFT performance improvements consistent with reduced source/drain resistance. Following the anneal, transmission electron microscropy (TEM) has revealed crystallinity in the source/drain regions, for example in the form of columnar grains illustrated in FIG. 4D for the TFT cell 101, and substantially as described above in the context of FIG. 1A. With the thermal anneal being of mutual benefit to both CMOS FET-based circuitry and TFT-based circuitry, the overhead associated increasing the order of the TFT source/drain regions is minimal and superior TFT performance may be had at little additional fabrication complexity or expense.

Figure 5:
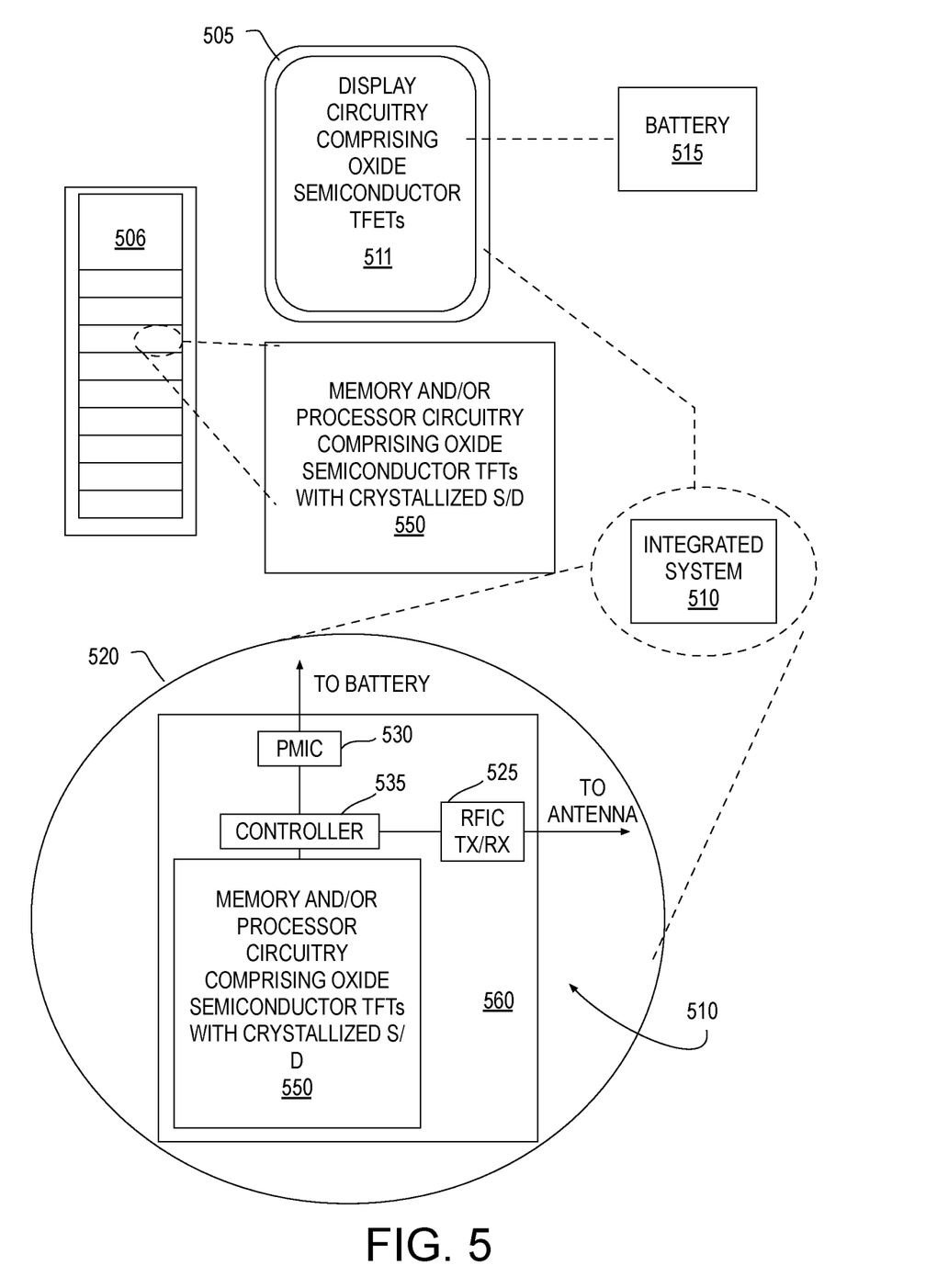
FIG. 5 illustrates a mobile computing platform and a data server machine employing an SoC having a TFT cell with a crystallized oxide semiconductor source/drain, in accordance with embodiments.

FIG. 5 illustrates a mobile computing platform and a data server machine employing an SoC including TFTs with an crystallized oxide semiconductor having more order than the oxide semiconductor channel, for example as described elsewhere herein. The server machine 506 may be any commercial server, for example including any number of high-performance computing platforms within a rack and networked together for electronic data processing, which in the exemplary embodiment includes a packaged monolithic SoC 550. The mobile computing platform 505 may be any portable device configured for each of electronic data display, electronic data processing, wireless electronic data transmission, or the like. For example, the mobile computing platform 505 may be any of a tablet, a smart phone, laptop computer, etc., and may include a display screen (e.g., a capacitive, inductive, resistive, or optical touchscreen), a chip-level or package-level integrated system 510, and a battery 515.

Either within the integrated system 510 illustrated in the expanded view 520, or as a stand-alone packaged chip within the server machine 506, monolithic SoC 550 includes a memory block (e.g., RAM), a processor block (e.g., a microprocessor, a multi-core microprocessor, graphics processor, or the like) including at least one TFT with a crystallized oxide semiconductor source/drain, for example as described elsewhere herein. The monolithic SoC 550 may be further coupled to a board, a substrate, or an interposer 560 along with, one or more of a power management integrated circuit (PMIC) 530, RF (wireless) integrated circuit (RFIC) 525 including a wideband RF (wireless) transmitter and/or receiver (TX/RX) (e.g., including a digital baseband and an analog front end module further comprises a power amplifier on a transmit path and a low noise amplifier on a receive path), and a controller 535.

Functionally, PMIC 530 may perform battery power regulation, DC-to-DC conversion, etc., and so has an input coupled to battery 515 and with an output providing a current supply to other functional modules. As further illustrated, in the exemplary embodiment, RFIC 525 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G+, and beyond. In alternative implementations, each of these board-level modules may be integrated onto separate ICs or integrated into monolithic SoC 550.

Figure 6:
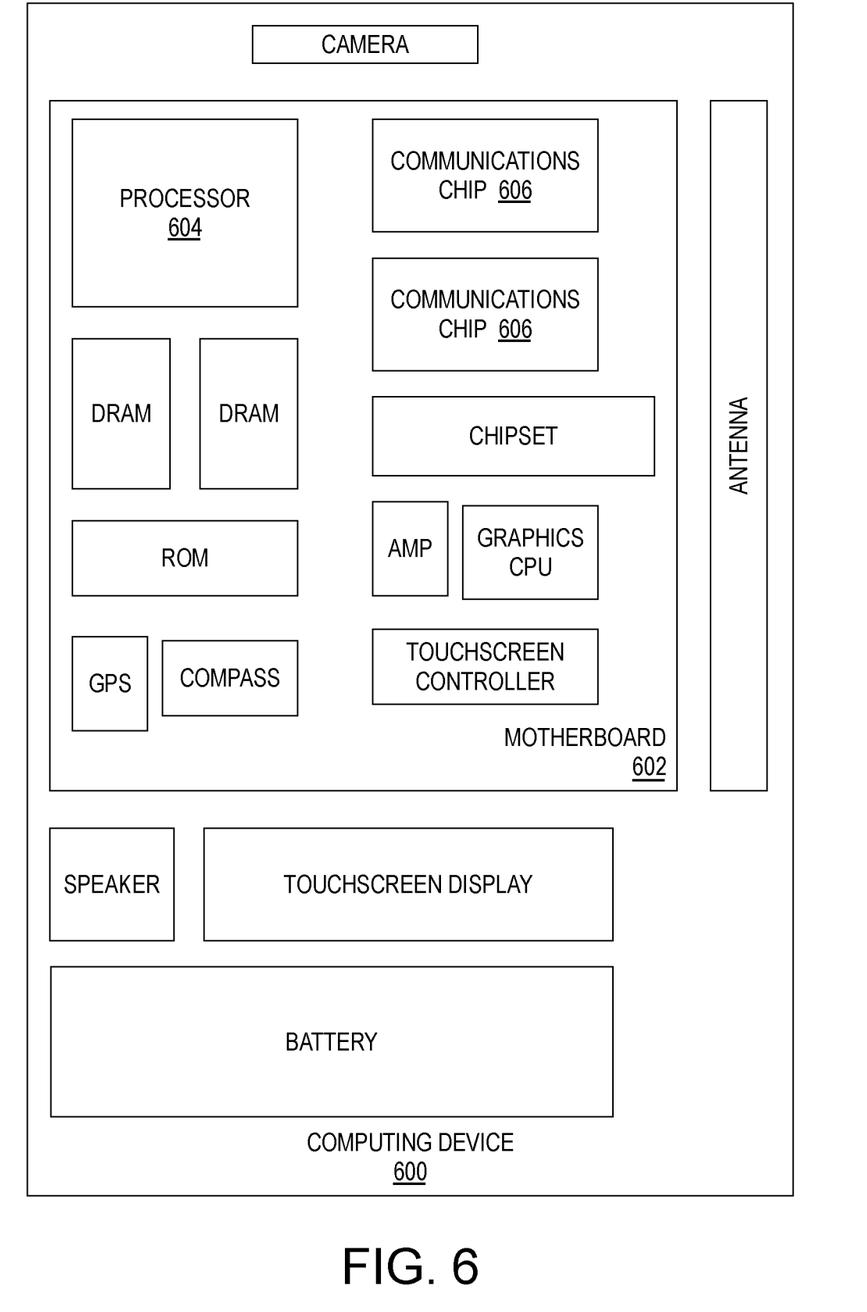
FIG. 6 is a functional block diagram of an electronic computing device, in accordance with some embodiments.

FIG. 6 is a functional block diagram of an electronic computing device, in accordance with some embodiments. Computing device 600 may be found inside platform 505 or server machine 506, for example. Device 600 further includes a motherboard 602 hosting a number of components, such as, but not limited to, a processor 604 (e.g., an applications processor), which may further incorporate at least one TFT with a crystallized oxide semiconductor source/drain, for example as described elsewhere herein. Processor 604 may be physically and/or electrically coupled to motherboard 602. In some examples, processor 604 includes an integrated circuit die packaged within the processor 604. In general, the term "processor" or "microprocessor" may refer to any device or portion of a device that processes electronic data from registers and/or memory to transform that electronic data into other electronic data that may be further stored in registers and/or memory.

In various examples, one or more communication chips 606 may also be physically and/or electrically coupled to the motherboard 602. In further implementations, communication chips 606 may be part of processor 604. Depending on its applications, computing device 600 may include other components that may or may not be physically and electrically coupled to motherboard 602. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 606 may implement any of a number of wireless standards or protocols, including but not limited to those described elsewhere herein. As discussed, computing device 600 may include a plurality of communication chips 606. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure. It will be recognized that principles of the disclosure are not limited to the embodiments so described, but can be practiced with modification and alteration without departing from the scope of the appended claims. For example the above embodiments may include specific combinations of features as further provided below.

In one or more first examples, a thin film transistor (TFT) structure comprises a channel comprising a semiconductor material including oxygen, a gate electrode coupled to the channel, and contact metallization coupled to the channel through a source or drain, the source or drain comprising a material and having greater crystallinity than that of the channel.

In one or more second examples, for any of the first examples the contact metallization has crystallinity, and the source or drain at an interface with the contact metallization has a crystal texture associated with the contact metallization crystallinity.

In one or more third examples, for any of the first and second examples the contact metallization has a columnar grain structure and the source or drain has a columnar grain structure.

In one or more fourth examples, for any of the first, second, or third examples a longitudinal axis of the columnar grain structure in the contact metallization and the source or drain is preferentially perpendicular to the interface of the source or drain and the contact metallization.

In one or more fifth examples, for any of the first, second, third, or fourth examples the contact metallization at the interface is a metal nitride and the source or drain comprises oxygen.

In one or more sixth examples, for any of the first, second, third, fourth or fifth examples, the metal nitride is selected from the group consisting of TiN, TaN, and WN.

In one or more seventh examples, for any of the first, second, third, fourth, fifth or sixth examples the source or drain has a thickness of 5-20 nm, the gate electrode has a lateral dimension of 10-50 nm, the contact metallization is laterally separated from the gate electrode by 3-7 nm. The greater crystallinity extends through the entire thickness of the source or drain, and the greater crystallinity extends laterally a distance beyond an edge of the contact metallization toward the channel.

In one or more eighth examples, for any of the first, second, third, fourth, fifth, sixth, or seventh examples the channel comprises a layer of semiconductor material between a gate stack and an amorphous dielectric underlayer or overlayer, the gate stack including the gate electrode and a high-k gate dielectric. The source or drain comprises a layer of semiconductor material between the contact metallization and the amorphous dielectric underlayer or overlayer.

In one or more ninth examples, for any of the first, second, third, fourth, fifth, sixth, seventh, or eighth examples the source or drain comprises a material including all the constituents in the channel.

In one or more tenth examples, for any of the first, second, third, fourth, fifth, sixth, seventh, eighth, or ninth examples the source or drain material further comprises an impurity at a concentration greater than in the channel.

In one or more eleventh examples, for any of the first, second, third, fourth, fifth, sixth, seventh, eighth, ninth or tenth examples least the channel comprises a metal oxide including at least one of Cu, Zn, Sn, Ti, Ni, Ga, In, Sb, Sr, Cr, Co, V, or Mo.

In one or more twelfth examples, for any of the first, second, third, fourth, fifth, sixth, seventh, eighth, ninth, tenth or eleventh examples at least the channel comprises a material selected from the group consisting of tin oxide, zinc oxide, and titanium oxide.

In one or more thirteenth examples, for any of the first, second, third, fourth, fifth, sixth, seventh, eighth, ninth, tenth, eleventh, or twelfth examples both the channel and source or drain comprise IGZO.

In one or more fourteenth examples, an integrated circuit (IC), comprises a plurality of n-type fin field effect transistor (finFET) structures and p-type finFET structures, one or more metallization levels interconnecting the n-type and p-type finFET structures into CMOS circuitry, and a plurality of thin film transistor (TFT) structures disposed over the metallization levels, or disposed on a side of a substrate opposite the finFET structures, and interconnected with the CMOS circuitry. Individuals of the TFT structures further comprise a channel comprising a semiconductor material including oxygen, a gate electrode over the channel, and contact metallization coupled to the channel through a source or drain, the source or drain comprising a material and having greater crystallinity than that of the channel.

In one or more fifteenth examples, for any of the fourteenth examples the oxide semiconductor within the channel and source or drain is selected from the group consisting of tin oxide, zinc oxide, and titanium oxide. The contact metallization at an interface with the semiconductor is a metal nitride selected from the group consisting of TiN, TaN, and WN. The gate electrode has a lateral dimension of 10-50 nm and is separated from the semiconductor channel by a high-k gate dielectric. The contact metallization has a columnar grain structure and the source or drain has a columnar grain structure. The source or drain has a thickness of 5-20 nm. The contact metallization is laterally separated from the gate electrode by 3-7 nm. Crystallinity within the source or drain extends through the entire thickness of the source or drain, and extends laterally a distance beyond an edge of the contact metallization toward the channel.

In one or more sixteenth examples, a method of fabricating a thin film transistor (TFT) structure comprises depositing a layer of semiconductor material comprising oxygen, forming gate stack over a first region of the semiconductor material. The method comprises forming contact metallization over a second region of the semiconductor, wherein the contact metallization includes a template layer in direct contact with the semiconductor material. The method comprises performing a thermal anneal that increases the crystallinity of the semiconductor material in the second region beyond that of the first region.

In one or more seventeenth examples, for any of the fifteenth or sixteenth examples the thermal anneal comprises exposing the TFT structure to a temperature of 300-400° C.

In one or more eighteenth examples, for any of the fifteenth, sixteenth, or seventeenth examples depositing the layer of semiconductor material further comprises depositing an amorphous layer of tin oxide, zinc oxide, and titanium oxide over an amorphous dielectric layer. Forming the contact metallization further comprises depositing metal nitride onto the semiconductor material.

In one or more nineteenth examples, for any of the fifteenth through eighteenth examples forming CMOS circuitry prior to depositing the semiconductor thin film, wherein forming the CMOS circuitry further comprises forming a plurality of n-type fin field effect transistor (finFET) structures and p-type finFET structures. The method comprises forming one or more metallization levels interconnecting the n-type and p-type finFET structures into the CMOS circuitry. The TFT structure is one of a plurality of TFT structures formed over the metallization levels, or disposed on a side of a substrate opposite the finFET structures, and interconnected with the CMOS circuitry.

In one or more twentieth examples, for any of the fifteenth through nineteenth examples the anneal comprises a forming gas anneal performed subsequent to the interconnection of the TFTs to the CMOS circuitry.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A thin film transistor (TFT) structure, comprising:
a channel comprising a semiconductor material comprising oxygen;
a gate electrode coupled to the channel; and
contact metallization coupled to the channel through a source or drain, the source or drain comprising a material having greater crystallinity than that of the channel, wherein:
the contact metallization has crystal texture with a preferred granular orientation; and
the source or drain at an interface with the contact metallization has the crystal texture with the preferred granular orientation of the contact metallization.

2. The structure of claim 1, wherein the greater crystallinity extends through a thickness of the source or drain, and extends laterally by an amount that is less than the thickness.

3. The structure of claim 1, wherein the contact metallization has a columnar grain structure and the source or drain at the interface has a columnar grain structure.

4. The structure of claim 3, wherein a longitudinal axis of the columnar grain structure within the contact metallization and within the source or drain are both preferentially perpendicular to the interface of the source or drain and the contact metallization.

5. The structure of claim 1, wherein the contact metallization at the interface is a metal nitride and the source or drain comprises oxygen.

6. The structure of claim 5, wherein the metal nitride comprises at least one of Ti, Ta, or W.

7. The structure of claim 1, wherein:
the source or drain has a thickness of 5-20 nm;
the gate electrode has a lateral dimension of 10-50 nm;
the contact metallization is laterally separated from the gate electrode by 3-7 nm;
the greater crystallinity extends through the entire thickness of the source or drain; and
the greater crystallinity extends laterally a distance beyond an edge of the contact metallization toward the channel.

8. The structure of claim 1, wherein:
the channel comprises a layer of semiconductor material between a gate stack and an amorphous dielectric material, the gate stack including the gate electrode and a high-k gate dielectric; and
the source or drain comprises layer of a semiconductor material between the contact metallization and the amorphous dielectric material.

9. The structure of claim 8, wherein the source or drain comprises a material including all the constituents in the channel.

10. The structure of claim 9, wherein the source or drain further comprises an impurity at a concentration greater than in the channel.

11. The structure of claim 1, wherein at least the channel comprises a metal oxide including at least one of Cu, Zn, Sn, Ti, Ni, Ga, In, Sb, Sr, Cr, Co, V, or Mo.

12. The structure of claim 11, wherein at least the channel comprises at least one of tin, zinc, or titanium.

13. The structure of claim 12, wherein the both the channel and the source or drain comprise an indium-gallium-zinc-oxide (IGZO).

14. An integrated circuit (IC), comprising:
a plurality of n-type fin field effect transistor (finFET) structures and p-type finFET structures;
one or more metallization levels interconnecting the n-type and p-type finFET structures into CMOS circuitry; and
a plurality of thin film transistor (TFT) structures over the metallization levels, or on a side of a substrate opposite the finFET structures, and interconnected with the CMOS circuitry, wherein individuals of the TFT structures further comprise:
a channel comprising a semiconductor material comprising oxygen;
a gate electrode over the channel; and
contact metallization coupled to the channel through a source or drain, the source or drain comprising a material having greater crystallinity than that of the channel, wherein:
the contact metallization has crystal texture associated with a preferred granular orientation; and
the source or drain at an interface with the contact metallization has the crystal texture with the preferred granular orientation of the contact metallization.

15. The IC of claim 14, wherein:
the channel and the source or drain is selected from the group consisting of tin oxide, zinc oxide, and titanium oxide;
wherein the contact metallization is a metal nitride comprising at least one of Ti, Ta, or W;
the gate electrode has a lateral dimension of 10-50 nm and is separated from the channel by a high-k gate dielectric;
the contact metallization has a columnar grain structure and the source or drain has a columnar grain structure;
the source or drain has a thickness of 5-20 nm;
the contact metallization is laterally separated from the gate electrode by 3-7 nm; and
the greater crystallinity within the source or drain extends through the entire thickness of the source or drain, and the greater crystallinity extends laterally a distance beyond an edge of the contact metallization toward the channel.

16. A method of fabricating a thin film transistor (TFT) structure, the method comprising:
depositing a layer of semiconductor material comprising oxygen;
forming gate stack over a first region of the semiconductor material;
forming contact metallization over a second region of the semiconductor material, wherein the contact metallization includes a template layer in direct contact with the semiconductor material; and
performing a thermal anneal that increases the crystallinity of the semiconductor material in the second region beyond that of the first region.

17. The method of claim 16, wherein the thermal anneal comprises exposing the TFT structure to a temperature of 300-400° C.

18. The method of claim 16, wherein:
depositing the layer of semiconductor material further comprises depositing an amorphous layer comprising at least one of tin, zinc, or titanium over an amorphous dielectric layer; and
forming the contact metallization further comprises depositing metal nitride onto the semiconductor material.

19. The method of claim 16, further comprising forming CMOS circuitry prior to depositing the semiconductor layer, wherein forming the CMOS circuitry further comprises:
   forming a plurality of n-type fin field effect transistor (finFET) structures and p-type finFET structures; and
   forming one or more metallization levels interconnecting the n-type and p-type finFET structures into the CMOS circuitry; and
wherein the TFT structure is one of a plurality of TFT structures formed over the metallization levels, or on a side of a substrate opposite the finFET structures, and interconnected with the CMOS circuitry.

20. The method of claim 19, wherein the anneal comprises a forming gas anneal performed subsequent to the interconnection of the TFT structures to the CMOS circuitry.

21. A thin film transistor (TFT) structure, comprising:
   a channel comprising a semiconductor material comprising oxygen;
   a gate electrode coupled to the channel; and
   contact metallization coupled to the channel through a source or drain, the source or drain comprising a material having greater crystallinity than that of the channel, wherein the greater crystallinity extends through a thickness of the source or drain, and extends laterally by an amount that is less than the thickness, and wherein:
      the contact metallization has crystallinity; and
      the source or drain at an interface with the contact metallization has a crystal texture associated with the contact metallization crystallinity.

\* \* \* \* \*